United States Patent [19]
Ludikhuize

[11] Patent Number: 5,796,146
[45] Date of Patent: Aug. 18, 1998

[54] SEMICONDUCTOR DEVICE HAVING A LATERAL INSULATED GATE BIOPOLAR TRANSISTOR

[75] Inventor: Adrianus W. Ludikhuize, Eindhoven, Netherlands

[73] Assignee: U.S. Philips Corporation, New York, N.Y.

[21] Appl. No.: 621,758

[22] Filed: Mar. 22, 1996

[30] Foreign Application Priority Data

Mar. 23, 1995 [EP] European Pat. Off. .............. 95200726

[51] Int. Cl.$^6$ .......................... H01L 29/76; H01L 29/74; H01L 31/111
[52] U.S. Cl. .............. 257/343; 257/141; 257/162
[58] Field of Search .............................. 257/343, 409, 257/378, 379, 492, 493, 162, 339, 341, 342, 141

[56] References Cited
PUBLICATIONS

"Lateral Insulated Gate Transistors With Improved Latching Characteristics", by A.L. Robinson et al, IEDM Tech. Dig. pp. 744–747, 1985.

*Primary Examiner*—Steven H. Loke
*Attorney, Agent, or Firm*—Steven R. Biren

[57] ABSTRACT

An LIGBT includes an LDMOST structure in which the drain/anode 9, 13 is provided with a pn junction which injects charge carriers into the drift region 8. To prevent latch-up, the base region 6 of the LDMOST is provided with deep zones 6b of the same conductivity type as the base region which extend locally comparatively far into the drift region. These zones collect charge carriers injected by the anode into the drift region and form a low-ohmic connection to the source contact 11 for these charge carriers. Since these zones are provided locally only, the threshold voltage of the LDMOST is not or at least substantially not influenced by the deep zones. In a modification, a ballast series resistance is provided in the source zone, so that latch-up is counteracted also at high temperatures.

6 Claims, 3 Drawing Sheets

SEMICONDUCTOR DEVICE HAVING A LATERAL INSULATED GATE BIOPOLAR TRANSISTOR

BACKGROUND OF THE INVENTION

The invention relates to a semiconductor device with a semiconductor body which at a surface is provided with a circuit element of the LIGBT type (lateral insulated gate bipolar transistor), and which comprises a surface layer of a first conductivity type adjoining the surface and merging into a region, called substrate hereinafter, of the second, opposed conductivity type via a pn junction at the side opposed to the surface, which circuit element comprises a base region of the second conductivity type provided in the surface layer, a source in the form of a surface zone of the first conductivity type provided in the base region, a drift region formed by a portion of the surface layer of the first conductivity type which adjoins the base region, a drain separated from the base region by the drift region and comprising a surface zone of the second conductivity type, and an insulated gate electrode above a channel region formed by a portion of the base region situated between the drift region and the source zone. Such a device is known, for example, from the article "Lateral insulated gate transistors with improved latching characteristics" by Robinson et al., published in IEDM Tech. Dig. pp. 744–747, 1985.

Circuit elements of this kind are known from the literature under various abbreviations such as LIGBT (lateral insulated gate bipolar transistor), LIGT (lateral insulated gate transistor), and LIGR (lateral insulated gate rectifier). Such elements are usually formed by an LDMOST (lateral DMOST) in which the drain forms a rectifying junction, for example a pn junction, with the drift region of the DMOST. In the ON-state, this rectifying junction becomes forward-biased and injects minority carriers into the drift region, whereby the conductivity of the drift region is increased. This effect may be further enhanced by the diode action (by which electrons are supplied through the MOS channel) and by bipolar transistor action by which the drain acts as an emitter and the base region of the DMOST as a collector for the injected charge carriers. Owing to the low ON-resistance and the lateral construction, these elements are particularly suitable for switching strong currents in integrated circuits. A problem which may arise in these circuit elements is the parasitic pnpn effect (in an n-channel transistor), often referred to as latching or latch-up, whereby the transistor may be damaged or even destroyed.

The publication by Robinson cited above contains a few suggestions for suppressing this pnpn (or npnp in the complementary case) effect. A suggestion illustrated in FIG. 2b of this publication is that the p-type base zone is provided at its side facing away from the drain with a deep p-type surface zone which extends from the surface into the p-type substrate. As is indicated in the publication, this method is less effective because the base resistance $r_{bb}$ of the parasitic npn transistor still remains comparatively high. According to another suggestion illustrated in FIG. 2c of the publication, a p-type buried layer is provided at the interface between the p-type substrate and the n-type surface layer below the entire base region, this buried layer extending from the substrate into the p-type base region. This method is highly effective for suppressing latch-up, but it also has major disadvantages. Thus the buried layer is capable of increasing the threshold voltage of the DMOST, whereby the channel current is considerably reduced for a given gate voltage. In addition, the presence of the buried layer may impose limits on the thickness of the epitaxial layer which forms the surface layer. In high-voltage applications it may be, for example, desirable or necessary, for example, to use very thick epitaxial layers.

SUMMARY OF THE INVENTION

The invention has for its object inter alia to provide a semiconductor device of the kind described in the opening paragraph in which latch-up is effectively suppressed, while the disadvantages of known devices described above as regards construction and/or operation are avoided.

A semiconductor device according to the invention is for this purpose characterized in that the source comprises sub-regions which, seen at the surface, are situated next to and at a distance from one another, and in that the base region comprises a first and a second sub-zone, the first sub-zone extending from the surface down to a comparatively small depth into the surface layer and separating said sub-regions of the source from the surface layer, and the second sub-zone of the base region extending from the surface down to a comparatively great depth into the surface layer and, seen at the surface, extending in lateral direction between the sub-regions of the source farther into the drift region than do the adjoining portions of the first sub-zone. Since the second, deeper sub-zone, whose resistivity is comparatively low, is provided at the same side of the base region as the channel, the base resistance of the parasitic npn transistor can be kept low, whereby the parasitic pnpn action is effectively avoided. Since this resistance-lowering zone is situated next to the actual channel region, the threshold voltage of the transistor is not or hardly influenced by the second sub-zone. Furthermore, the second sub-zone may be formed by a surface zone of a suitable depth and doping concentration, while a comparatively great freedom remains as to the choice of other parameters such as the thickness of the surface layer.

An embodiment which has the advantage inter alia that the LIGBT can be readily incorporated in an integrated circuit, the second sub-zone being formed simultaneously with the island insulation, is characterized in that the second sub-zone of the base region is conductively connected to the substrate of the second conductivity type.

An important embodiment of a device according to the invention is characterized in that the sub-regions of the source of the first conductivity type are mutually separated by interposed portions of the base region of the second conductivity type. The subdivision of the source zone into separate sub-zones reduces the resistance in the base region, whereby the parasitic pnpn (or npnp) effect is further suppressed.

It was further found in practice that latch-up may occur in bigger transistors, i.e. transistors with a higher W/L ratio, at lower current densities than in smaller transistors. A further embodiment of a semiconductor device according to the invention is characterized in that said sub-regions of the source are each provided with a ballast resistance. The invention is based inter alia on the recognition here that the difference in latch-up behaviour between big and small transistors is possibly caused by thermal effects: the temperature in the center of a big transistor may become somewhat higher than at the edge, so that locally the base resistance also becomes higher and the pnpn in the center becomes active earlier. The ballast resistance provides a negative feedback whereby the voltage across the pn junction between the source zone and the base region is locally reduced.

BRIEF DESCRIPTION OF THE DRAWINGS

The invention will be explained in more detail with reference to a several embodiments and the accompanying diagrammatic drawing, in which.

Figure 1:
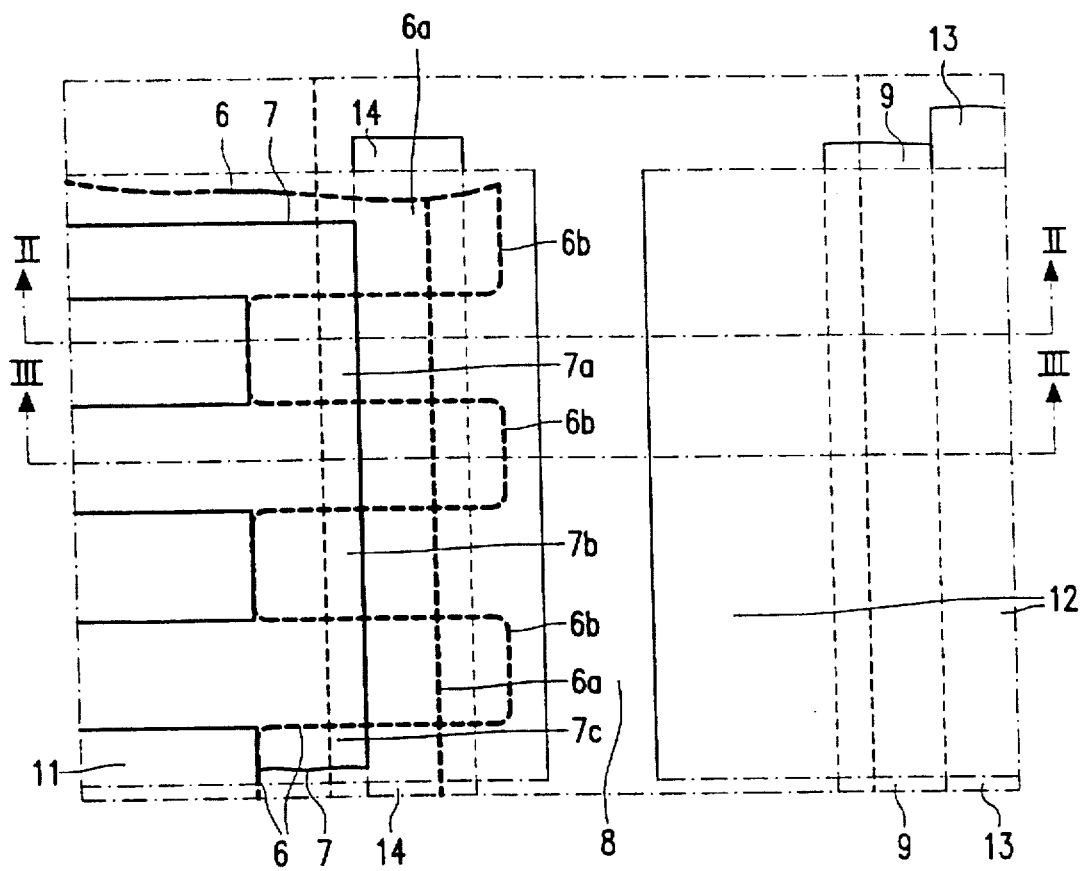
FIG. 1 is a plan view of a semiconductor device according to the invention.

It is noted that the drawing is diagrammatic and not true to scale. The dimensions in vertical direction are shown particularly exaggerated. In addition, only that portion of the device which comprises the LIGBT is shown in the drawing. It will become apparent to those skilled in the art from the ensuing description that the LIGBT may form part of an integrated circuit together with other circuit elements. Since these further elements, such as bipolar transistors, diodes, resistors, etc., can be manufactured entirely by methods which are known per se, these elements are not discussed here any further.

DESCRIPTION OF THE PREFERRED EMBODIMENTS

Figure 2:
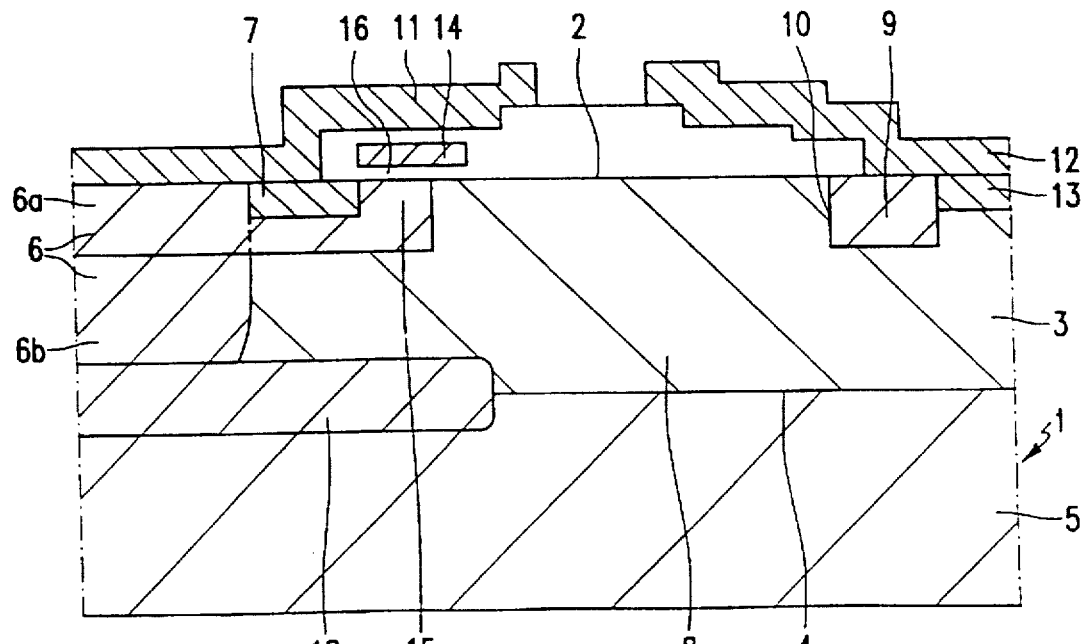
FIG. 2 is a cross-section of this device taken on the line II—II.
Figure 3:
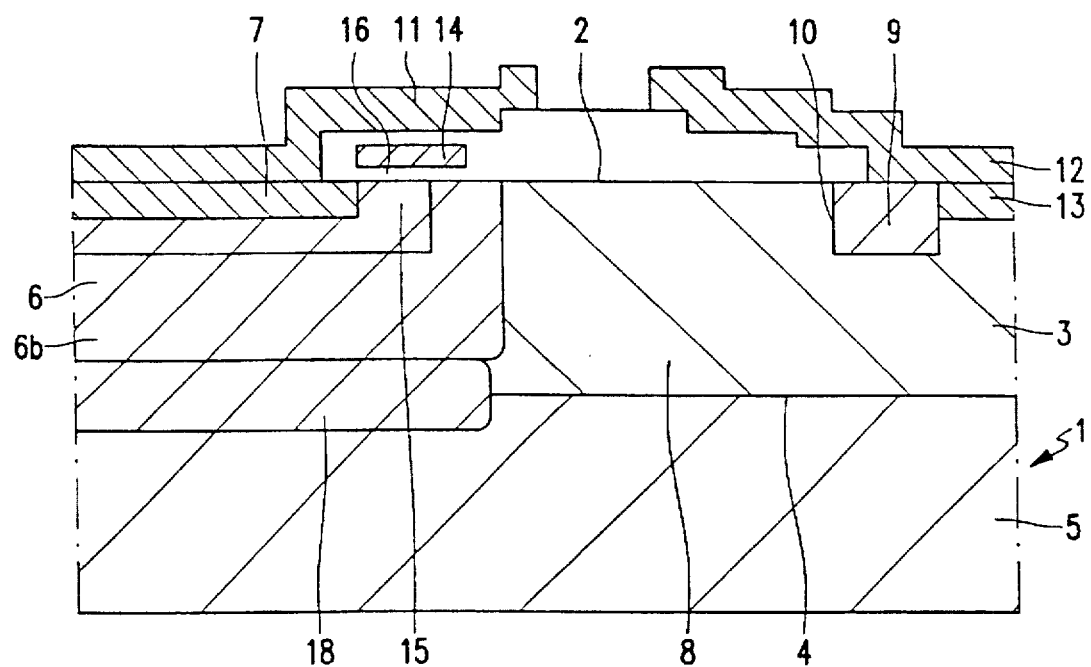
FIG. 3 is a cross-section of this device taken on the line III—III.

FIGS. 1 to 3 show a first embodiment of a device according to the invention. The device comprises a semiconductor body 1 which in this example is made of silicon but which obviously may be made from any other suitable semiconductor material which is known per se. The semiconductor body comprises a surface layer 3 of a first conductivity type, in this case the n-type, which adjoins the surface 2 and which at the side facing away from the surface merges into a region 5, called substrate hereinafter, of the second conductivity type, so of the p-type in this example, via a pn junction 4. The LIGBT is substantially formed by a lateral DMOST (LDMOST) configuration comprising a p-type base region 6 provided in the n-type surface layer 3. An n-type surface zone 7 is formed in the base region 6, is insulated from the n-type surface layer 3 by the p-type region 6, and forms a source zone of the transistor. The LDMOST configuration further comprises a drift region formed by that portion 8 of the surface layer 3 which adjoins the base region 6. At the other side, the drift region is bounded by the drain of the transistor, also often called anode in the case of an LIGBT, and comprises a p-type surface zone 9 which forms a pn junction 10 with the drift region 8.

The source zone 7 and the base region 6 are conductively connected to the source contact 11 which short-circuits the pn junction between the zones 6 and 7. The drift region 8 together with the strongly doped n-type contact zone 13 is connected to the drain contact 12 which at the same time forms a connection for the zone 9 which short-circuits the pn junction 10. The transistor further comprises a gate electrode 14 which is provided above the channel region 15 formed by that portion of the base region 6 which is situated between the source zone 7 and the drift region 8. The gate electrode 14 is separated from the channel region 15 by the gate dielectric 16, usually formed by silicon oxide.

The source zone comprises a number of sub-regions which in FIG. 1 are given the reference numerals 7a, 7b, 7c, etc. and which, seen at the surface, are situated next to and at a distance from one another. The base region 6 is composed of a first sub-zone 6a and a second sub-zone 6b indicated with broken lines in FIG. 1 for clarity. The first sub-zone 6a, which forms the channel region 15 of the transistor, extends from the surface 2 of the semiconductor body down to a comparatively small depth into the surface layer 3. The second sub-zone 6b extends much more deeply into the surface layer 3 from the surface 2. As is apparent from FIG. 1, the sub-zone 6b extends between the sub-regions 7a, 7b, etc. in lateral direction farther into the drift region 8 than do the adjoining portions of the first, shallow sub-zone 6a of the base region.

Figure 4:
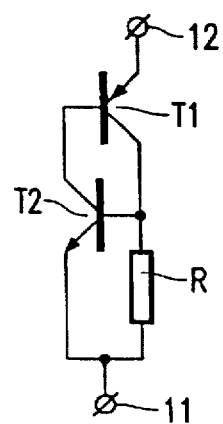
FIG. 4 is an equivalent circuit diagram of the parasitic pnpn of this device.

To clarify the effect of the LIGBT described here, FIG. 4 shows an equivalent circuit diagram of the parasitic pnpn. The pnp transistor $T_1$ is formed by the p-type zone 9, the n-type drift region 8, and the p-type base 6 which form the emitter, the base, and the collector, respectively, of the pnp transistor. The npn transistor $T_2$ comprises the n-type region 7, the p-type region 6, and the n-type drift region 8 which form the emitter, the base, and the collector, respectively, of the npn transistor. The holes injected by the anode zone 9 into the drift region 8 and collected by the p-type base region flow below the source zone 7 towards the connection 11. The corresponding resistance is represented by R in FIG. 4. In proportion as this resistance is greater, the pnpn transistor will become conducting at a lower current. The presence of the low-ohmic sub-zones 6b strongly decreases the resistance R in the base region. The threshold voltage of the LIGBT is at the same time determined by the concentration of the sub-zone 6a and may thus be kept at a desired low value.

A further reduction in said resistance may be obtained through the use of a p-type buried zone 18 between the substrate 5 and the surface layer 3, which buried zone may extend below the entire base region 6, as shown in FIG. 2.

This embodiment of the LIGBT is suitable for operation at high voltages. For this purpose, the manufacture starts with a comparatively high-ohmic p-type substrate 5 with a resistivity of, for example, approximately 90 ohms.cm. Buried zones of the p-type are formed in known manner, such as the buried zone 18, which has a higher doping concentration than that of the substrate 5 as shown by the more closely-spaced hatching of buried zone 18 in FIGS. 2 and 3, and of the n-type elsewhere in the semiconductor body, where other circuit elements are formed such as bipolar transistors. An n-type surface layer 3 which is, for example, 23 μm thick is epitaxially deposited with a resistivity of approximately 6 ohms.cm on the substrate 5. The thickness and doping concentration are such that the high-voltage elements can use the resurf principle known from the literature whereby the epitaxial layer is depleted throughout its thickness from the substrate at least locally before breakdown takes place. In a next step, the deep p-type sub-zone 6b is provided, for example through diffusion of boron atoms. Island insulation zones may be formed simultaneously with this diffusion, subdividing the epitaxial layer into islands which are mutually electrically insulated. The width of the projecting fingers 6b and the interspacings between the fingers are, for example, approximately 30 μm. The gate oxide 16 is grown to a thickness of 0.1 μm by means of thermal oxidation, whereupon a layer of polycrystalline silicon, called poly hereinafter, is deposited, doped, and patterned so as to obtain the gate electrode 14 of the LIGBT, and possibly portions of further circuit elements, if so desired. Then the p-type zones 6a and 9 are provided, followed by the formation of the n-type zones 7 and 13. The surface is then covered with a dielectric layer of oxide and/or nitride in which contact windows are provided in a usual manner. A metal layer of, for example, Al doped with Si is subsequently deposited and patterned so as to obtain the contacts. It is noted that the source and drain contacts 11 and 12 of the LIGBT extend to above the drift region and thus form a field plate with which a better field distribution, and thus a higher breakdown voltage are obtained.

Figure 5:
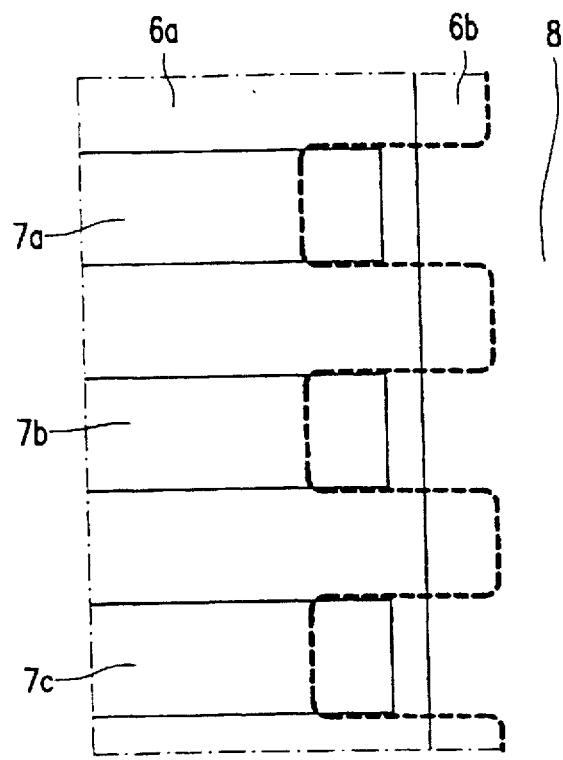
FIG. 5 is a plan view of a second embodiment of a semiconductor device according to the invention.

In the embodiment described here, the source zone 7 forms a continuous region in which the threshold voltage of the transistor is increased at the areas of the fingers 6b compared with the areas between the fingers 6b. A further reduction of the resistance R in FIG. 4, whereby the LIGBT may be further increased while latch-up is avoided, is shown in FIG. 5. The source zone 7 and the base region 6 only are shown in the drawing. The remaining components are identical to the corresponding components in FIG. 1 and are not indicated in FIG. 5 for greater clarity. The base region 6 again comprises a shallow p-type zone 6a which defines the threshold voltage of the LDMOST, and a deep zone 6b provided with fingers which project into the drift region 8 and form a collector for holes injected into the drift region by the anode which is not shown in the Figure. The source zone does not form a continuous region, as in the previous example, but here comprises a number of separate zones 7a, 7b, 7c mutually separated by the p-type base zone 6. Although the channel length of the LDMOST in this construction is smaller than in the preceding example, this has comparatively little influence on the current through the transistor owing to the high threshold voltage in the regions 6b. By contrast, the absence of the n-type zone at the areas of the p-type fingers 6b strongly reduces the base resistance R.

Figure 6:
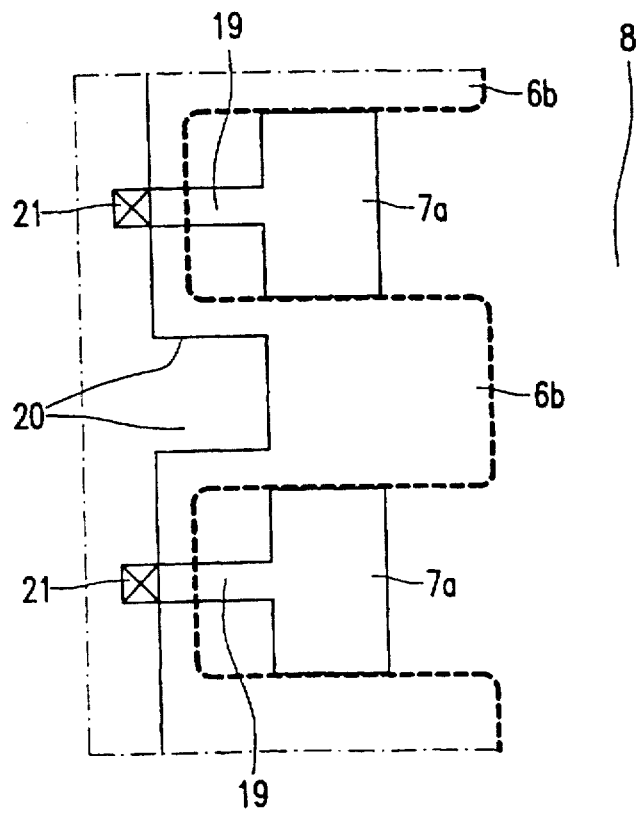
FIG. 6 is a plan view of a further embodiment of a semiconductor device according to the invention.

It was further found in practice that the current level through the LIGBT at which latch-up occurs is often lower in big transistors than in smaller transistors. A possible explanation of this is that the temperature in the center is somewhat higher than in the periphery, and thus also the local resistance R, see FIG. 4, owing to a bad heat removal in the center of the LIGBT compared with the periphery. This effect may be counteracted by means of a resistance in the emitter path of the npn sub-transistors whose emitters are formed each by a sub-zone 7a, 7b, etc. This resistance may be obtained by means of the internal resistances of the zones 7a, 7b, 7c themselves. A plan view of an embodiment in which this is realized is shown in FIG. 6. In this Figure, the fingers 6b of the deep sub-zone of the base region and sub-regions 7a and 7b have been drawn. These sub-regions are provided with narrowed portions 19 which result in a resistance of a suitable value. The drawing further shows the contact window 20 where the base region 6 and the source region 7 are connected to the source contact 11 which is not shown in the drawing. The contact window 20 is provided with a constriction at the area of the narrowed portion 19, so that the source contact 11 makes contact with the sub-regions 7a, 7b, etc. at the area of the cross 21 only. Given a layer resistance of approximately 10 ohms, it is possible in this manner to achieve an emitter series resistance of a few tens of ohms per section of 30 μm, which is sufficient in most cases.

It will be clear that the invention is not limited to the embodiments given here, but that many more variations are possible to those skilled in the art within the scope of the invention. Thus the conductivity types of the embodiments described above may be reversed. Furthermore, the p-type anode zone 9 in the embodiments described here may be provided in the form of a number of sub-zones situated next to one another and mutually separated by interposed portions of the n-type surface layer 3. As was described inter alia in European Patent Application published under number EP-A1 0 361 589 on Apr. 4, 1990, such a subdivision of the anode may yield a considerable improvement in the speed of the LIGBT, in particular upon switching-off of the transistor.

I claim:

1. A semiconductor device with a semiconductor body which at a surface is provided with a circuit element of the lateral insulated gate bipolar transistor type, and which comprises a surface layer of a first conductivity type adjoining the surface and contacting a substrate region of a second, opposed conductivity type at a pn junction at a side opposed to the surface, which circuit element comprises a base region of the second conductivity type provided in the surface layer, a source comprising a surface zone of the first conductivity type provided in the base region, a drift region formed by a portion of the surface layer of the first conductivity type which adjoins the base region, a drain separated from the base region by the drift region and comprising a surface zone of the second conductivity type, and an insulated gate electrode above a channel region formed by a portion of the base region situated between the drift region and the source, characterized in that the source comprises sub-regions which, seen at the surface, are situated adjacent but spaced apart from one another, and in that the base region comprises a first sub-zone and a second sub-zone, the first sub-zone extending from the surface down to a comparatively small depth into the surface layer and separating said sub-regions of the source from the surface layer, and the second sub-zone of the base region extending from the surface down to a comparatively great depth into the surface layer and, seen at the surface, extending in a lateral direction between the sub-regions of the source farther into the drift region than do the adjoining portions of the first sub-zone.

2. A semiconductor device as claimed in claim 1, characterized in that the second sub-zone of the base region is conductively connected to the substrate region of the second conductivity type.

3. A semiconductor device as claimed in claim 1, characterized in that the sub-regions of the source of the first conductivity type are mutually separated by interposed portions of the base region of the second conductivity type.

4. A semiconductor device as claimed in any one of the preceding claims, characterized in that a buried zone of the second conductivity type is provided between the surface layer and the substrate region, which buried zone has a higher doping concentration than the substrate region, extends from the substrate region partly into the surface layer, and further extends below at least substantially the entire base region.

5. A semiconductor device as claimed in claim 1, characterized in that said sub-regions of the source are each provided with a ballast resistance between the corresponding sub-region and a source contact provided on the surface of the semiconductor body.

6. A semiconductor device as claimed in claim 1, characterized in that the circuit element forms part of an integrated circuit, in which the surface layer is subdivided into a number of islands, in which further circuit elements are provided, by means of insulation zones of the second conductivity type which extend from the surface through the entire thickness of the surface layer down to the substrate region.

* * * * *